US012557437B2

(12) United States Patent
Charles et al.

(10) Patent No.: US 12,557,437 B2
(45) Date of Patent: Feb. 17, 2026

(54) METHOD OF VERTICAL GROWTH OF A III-V MATERIAL

(71) Applicants: COMMISSARIAT A L'ENERGIE ATOMIQUE ET AUX ENERGIES ALTERNATIVES, Paris (FR); CNRS, Paris (FR)

(72) Inventors: Matthew Charles, Grenoble (FR); Yvon Cordier, Valbonne (FR)

(73) Assignees: COMMISSARIAT A L'ENERGIE ATOMIQUE ET AUX ENERGIES ALTERNATIVES, Paris (FR); CNRS, Paris (FR)

( * ) Notice: Subject to any disclaimer, the term of this patent is extended or adjusted under 35 U.S.C. 154(b) by 578 days.

(21) Appl. No.: 18/051,914

(22) Filed: Nov. 2, 2022

(65) Prior Publication Data

US 2023/0136949 A1 May 4, 2023

(30) Foreign Application Priority Data

Nov. 2, 2021 (FR) .................................. 21 11632

(51) Int. Cl.
*H10H 20/01* (2025.01)
*H01L 21/02* (2006.01)
(Continued)

(52) U.S. Cl.
CPC ..... *H10H 20/0137* (2025.01); *H01L 21/0254* (2013.01); *H10D 8/00* (2025.01);
(Continued)

(58) Field of Classification Search
CPC ......... H10H 20/0137; H10H 20/01335; H10H 20/032; H01L 21/0254; H01L 21/02458;
(Continued)

(56) References Cited

U.S. PATENT DOCUMENTS 4,952,526 A * 8/1990 Pribat ................. H01L 21/0262
117/923
5,525,536 A 6/1996 Ueda
(Continued)

FOREIGN PATENT DOCUMENTS

| EP | 0 336 830 A1 | 10/1989 |
| EP | 1 378 934 A1 | 1/2004 |
| FR | 3 080 487 B1 | 10/2019 |

OTHER PUBLICATIONS

French Preliminary Search Report and Written Opinion Issued Sep. 12, 2022 in French Application 21 11632 filed on Nov. 2, 2021 (with English Translation of Categories of Cited Documents), 13 pages.
(Continued)

*Primary Examiner* — Ajay Ojha
*Assistant Examiner* — Sandra Milena Rodriguez Villanu
(74) *Attorney, Agent, or Firm* — Oblon, McClelland, Maier & Neustadt, L.L.P.

(57) ABSTRACT

A method for growing a III-V material may include forming at least one layer on a stack including a crystalline layer made of III-V material, a first masking layer surmounting the germination layer, the first masking layer having at least one first opening; depositing a second masking layer covering an upper face of the sacrificial layer; forming at least one second opening in the second masking layer; removing the sacrificial layer selectively at the first masking layer and at the second masking layer; epitaxially growing a material made of the III-V material from the germination layer;
(Continued)

forming at least one third opening in the second masking layer; and epitaxially growing at least one material made of the III-V material from the first epitaxial layer.

20 Claims, 7 Drawing Sheets

(51) Int. Cl.
   *H10D 8/00*     (2025.01)
   *H10H 20/812*   (2025.01)

(52) U.S. Cl.
   CPC .... *H10H 20/01335* (2025.01); *H10H 20/812* (2025.01); *H10H 20/032* (2025.01)

(58) Field of Classification Search
   CPC ......... H01L 21/02576; H01L 21/02579; H01L 21/0262; H01L 21/02639; H01L 21/02647; H01L 21/02634; H10D 8/00
   See application file for complete search history.

(56) References Cited

U.S. PATENT DOCUMENTS

| | | | |
|---|---|---|---|
| 2004/0087115 A1 | 5/2004 | Nagai et al. | |
| 2007/0224784 A1* | 9/2007 | Soloviev | H01L 21/02378 |
| | | | 257/E21.132 |
| 2017/0117138 A1* | 4/2017 | Xiao | H01L 21/31116 |

OTHER PUBLICATIONS

Wang, J. et al., "Non-Polar True-Lateral GaN Power Diodes on Foreign Substrates", Applied Physics Letters, vol. 118, No. 212102, 2021, 6 pages.

Czornomaz, L. et al., "Confined Epitaxial Lateral Overgrowth (CELO): A Novel Concept for Scalable Integration of CMOS Compatible InGaAs-on-Insulator MOSFETs on Large-Area Si Substrates", Symposium on VLSI Technology Digest of Technical Papers, IEEE, 2015, 2 pages.

Debald A. et al., "Selective-Area Growth Study of GaN Micropillars for Quasi-Vertical Schottky Diodes", Semiconductor Science and Technology, vol. 36, No. 3, 2021, 13 pages.

* cited by examiner

[Fig. 1]
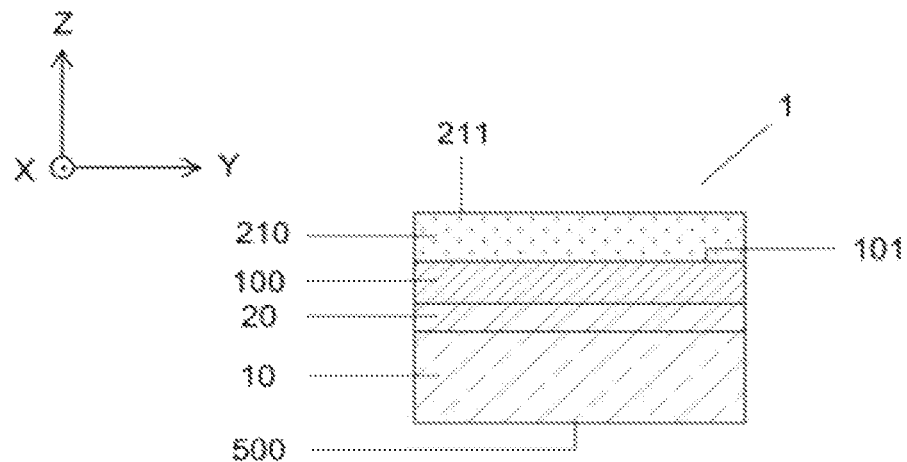
[Fig. 2]
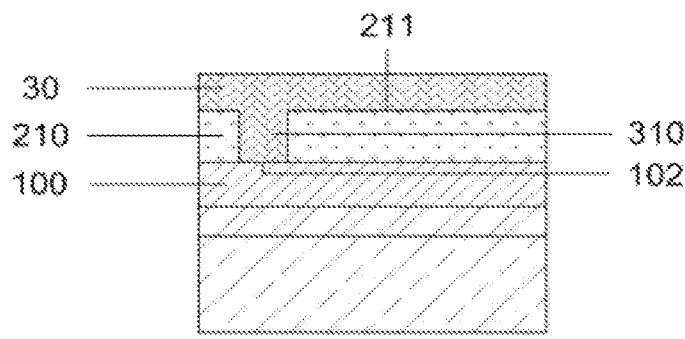
[Fig. 3]
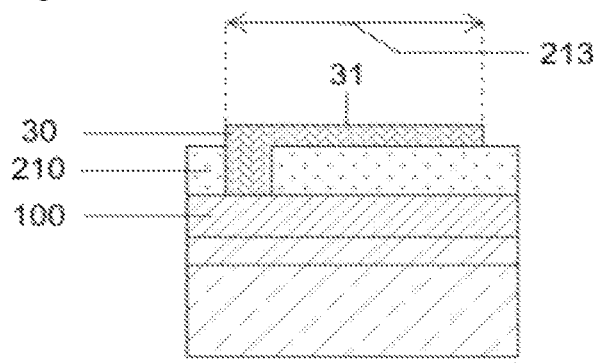
[Fig. 4]
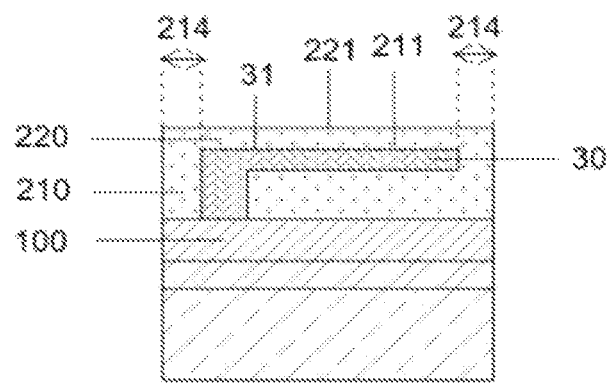

[Fig. 5]
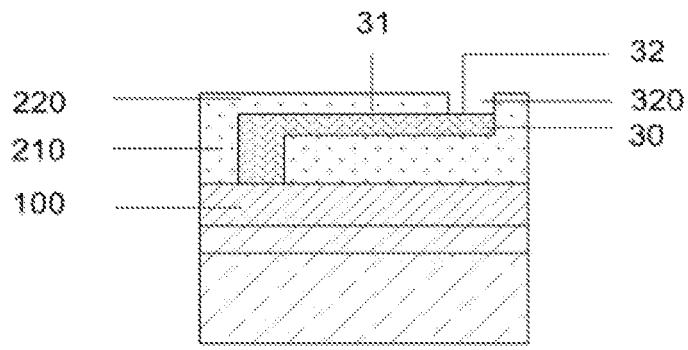
[Fig. 6]
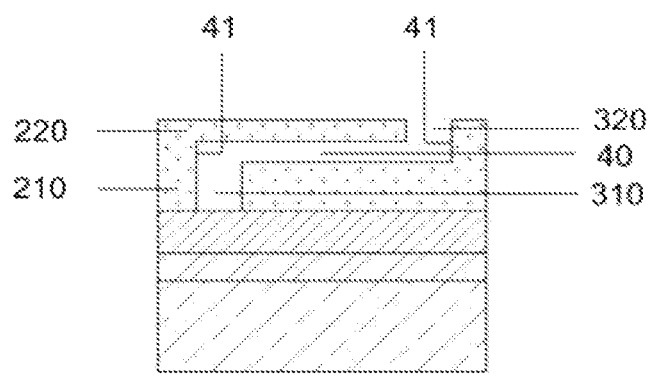
[Fig. 7]
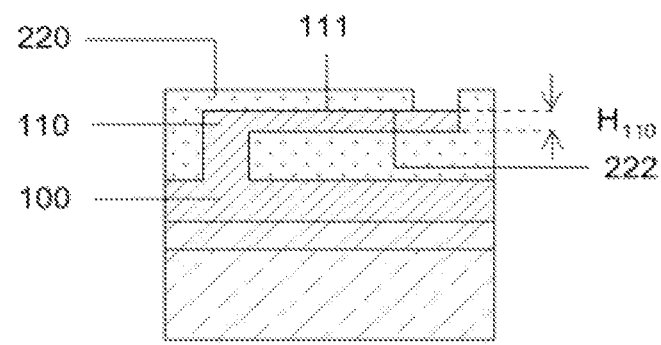
[Fig. 8]
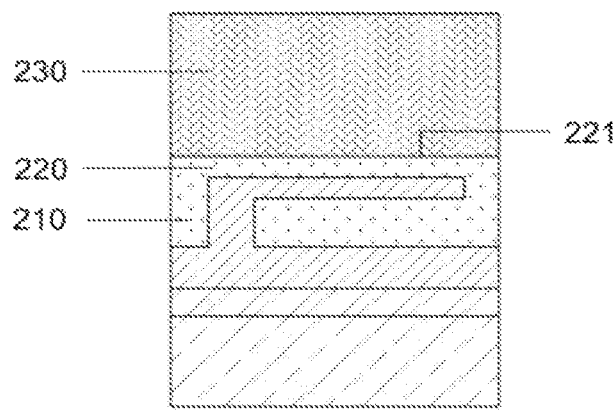

[Fig. 9]
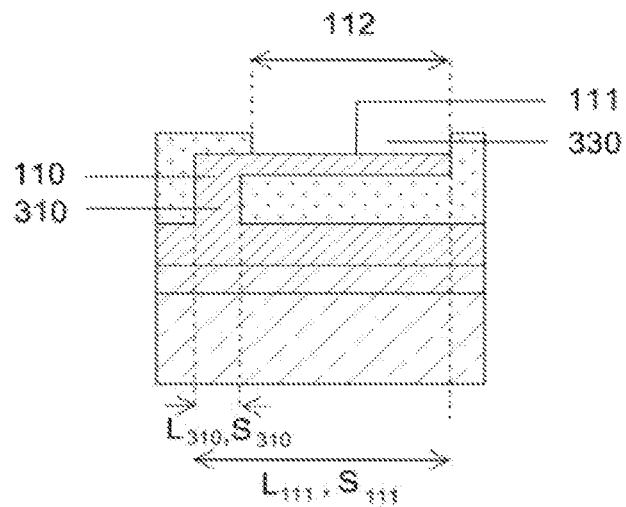
[Fig. 10]
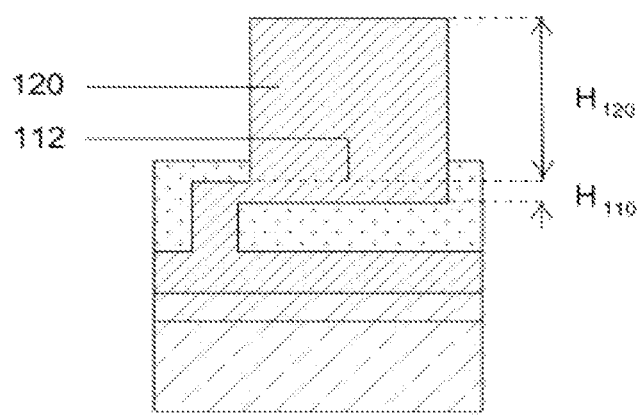
[Fig. 11]
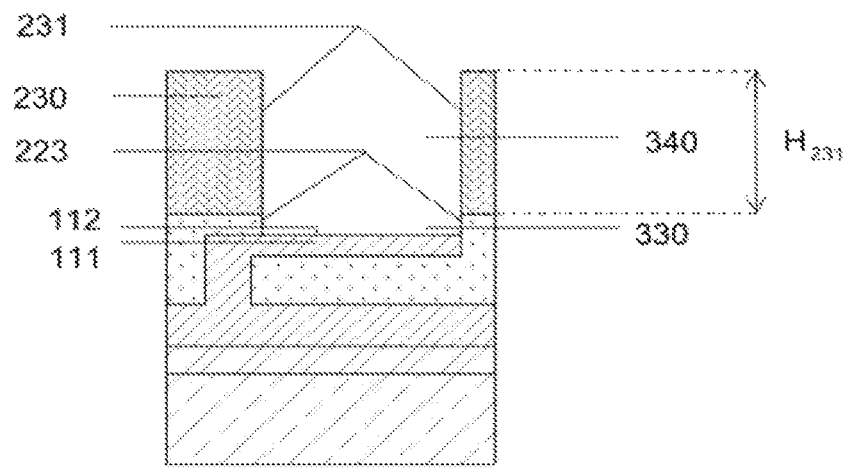

[Fig. 12]
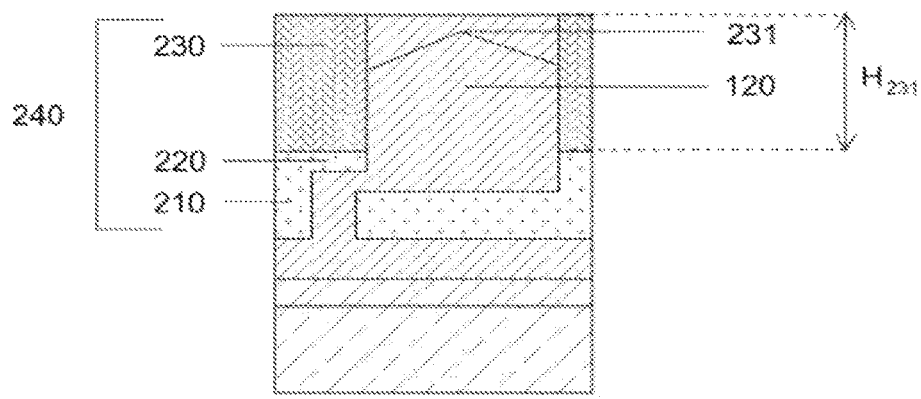
[Fig. 13]
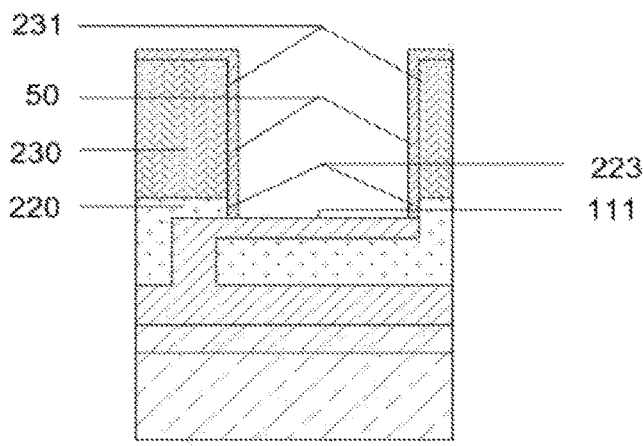
[Fig. 14]
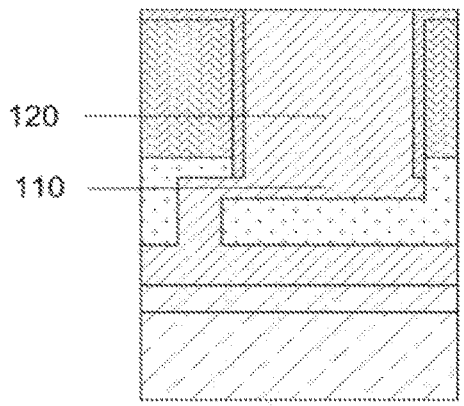
[Fig. 15]
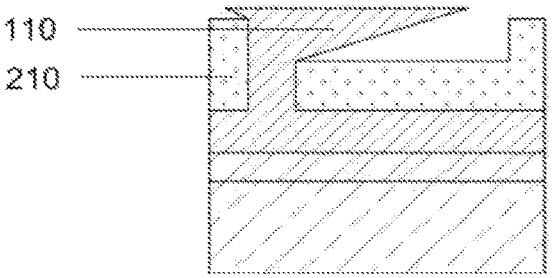

[Fig. 16]
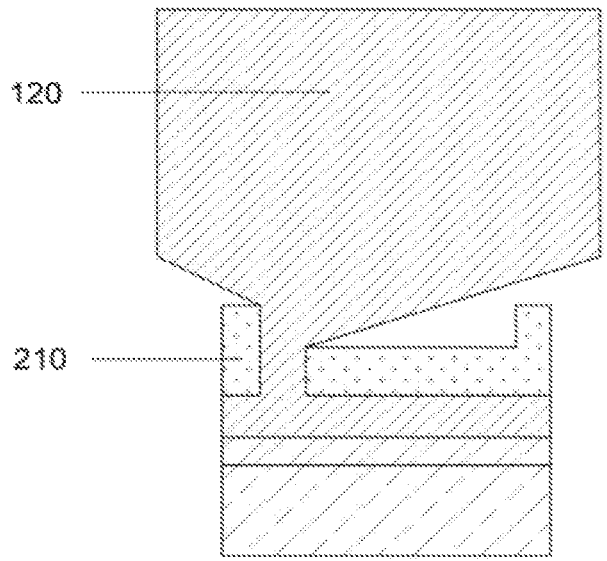
[Fig. 17]
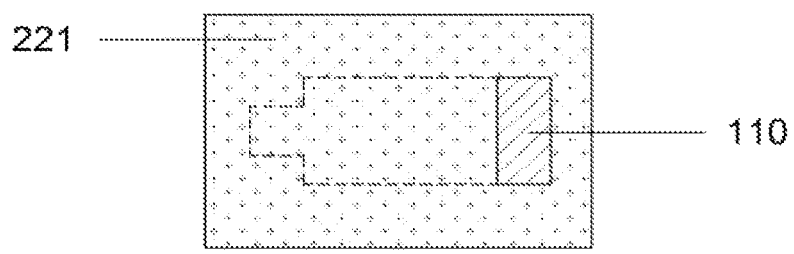
[Fig. 18]
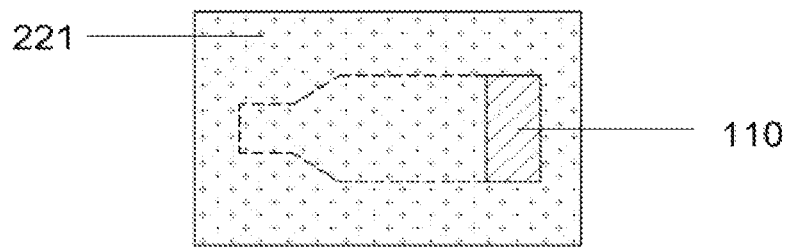
[Fig. 19]
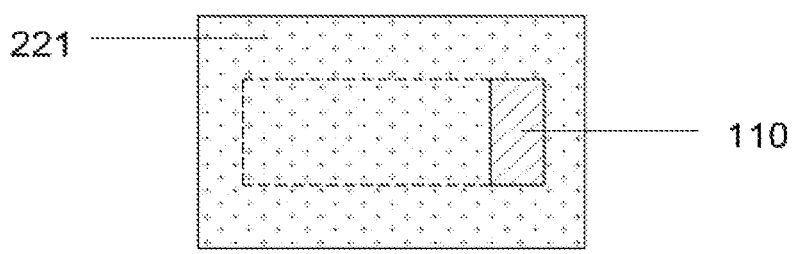

[Fig. 20]
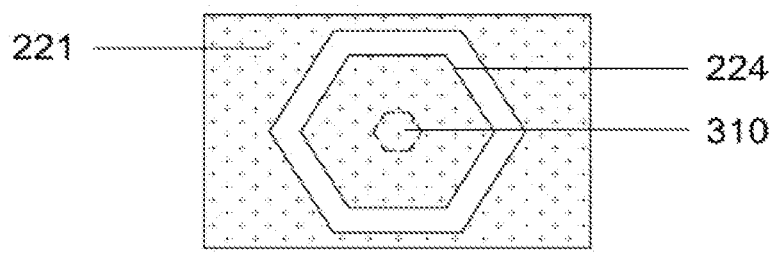
[Fig. 21]
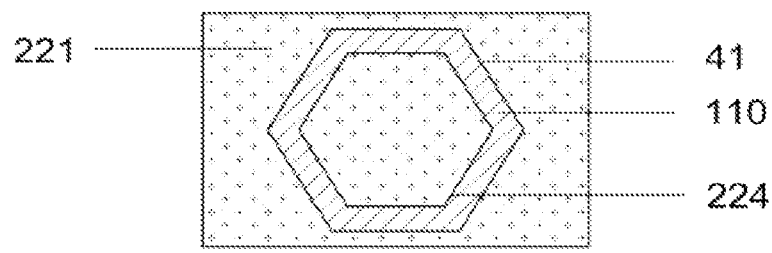
[Fig. 22]
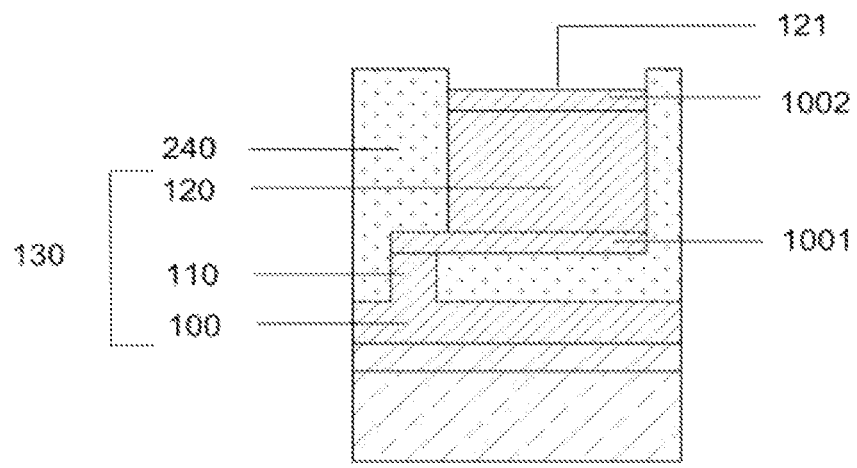
[Fig. 23]
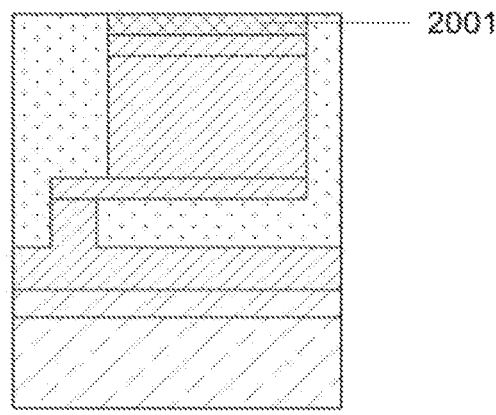

[Fig. 24]
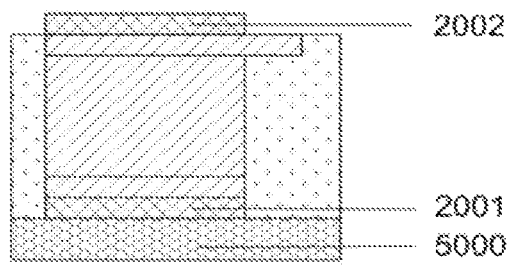
[Fig. 25]
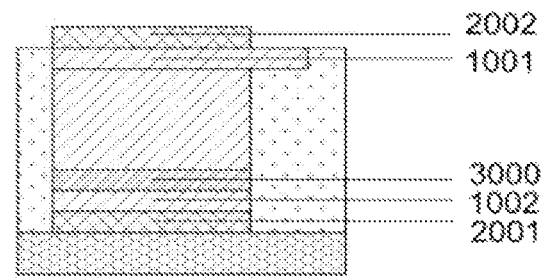
[Fig. 26]
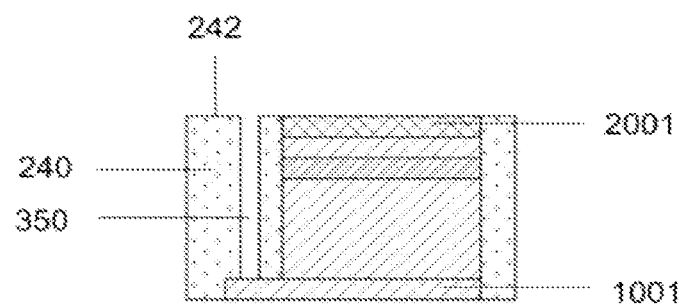
[Fig. 27]
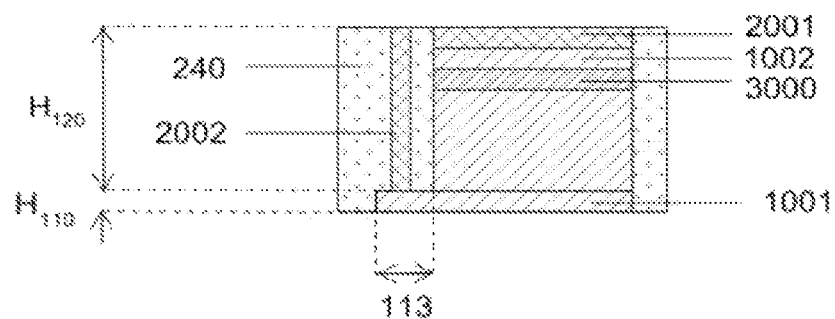

METHOD OF VERTICAL GROWTH OF A III-V MATERIAL

CROSS-REFERENCE TO RELATED APPLICATIONS

The present application claims the benefit of the filing date of French Appl. No. 2111632, filed on Nov. 2, 2021.

TECHNICAL HELD

The present invention relates to the growth of III-V materials, such as GaN. Advantageously, it enables the growth of III-V materials to produce so-called vertical microelectronic devices. It has, for example, a particularly advantageous application in the field of power electronics.

STATE OF THE ART

Power electronic components, typically GaN-based, are currently made from so-called lateral devices, like high electron mobility transistors (HEMT), or from so-called vertical devices produced mainly on GaN substrates.

Vertical devices have numerous advantages. Due to their dimensions, they occupy less surface area than lateral devices; and also encounter less problems linked to the presence of traps.

However, current solutions for obtaining these vertical devices have numerous disadvantages.

A solution consists of making a GaN layer grow vertically from GaN substrates, also called free-standing GaN substrates. This solution makes it possible to obtain good performances. However, this solution has, as a disadvantage, that these GaN substrates are very expensive and are only available in small dimensions, typically substrates of 5 cm ($5 \cdot 10^{-2}$ m) in diameter.

An alternative to the substrate growth of GaN is silicon on substrate growth ("GaN on Silicon"), which has the advantage of being more economical and of making it possible to access substrates with large diameters. This alternative however has two major disadvantages. The GaN layers thus obtained have very high dislocation densities, of around $10^9$ $cm^{-2}$. Moreover, due to the difference between the mesh parameter of GaN and that of silicon; it is difficult to obtain very thick layers, yet necessary for manufacturing vertical devices.

The present invention therefore aims to reduce the disadvantages mentioned above linked to the growth of thick layers of III-V materials, and for example the growth of thick layers of materials III-N and more specifically, GaN on a silicon substrate.

Other aims, features and advantages of the present invention will appear upon examining the following description and accompanying drawings. It is understood that other advantages can be incorporated.

SUMMARY

To achieve the aims mentioned above, a first aspect of the invention relates to a method for growing a III-V material comprising:

A provision of a stack comprising a crystalline layer made of III-V material called germination layer, a first masking layer surmounting the germination layer, the first masking layer having at least one first opening exposing a part of an upper face of the germination layer, A formation of at least one sacrificial layer filling the first opening and extending from the first opening over at least one first region of an upper face of the first masking layer, A deposition of a second masking layer covering an upper face of the sacrificial layer and covering at least one second region of the upper face of the first masking layer, the second region not being covered by the sacrificial layer, A formation of at least one second opening in the second masking layer, so as to make a part of the upper face of the sacrificial layer accessible, A removal of the sacrificial layer selectively with respect to the first masking layer and to the second masking layer, so as to form at least one cavity, An epitaxial growth of a material made of the III-V material from the germination layer in the first opening and in the cavity, so as to form at least one first epitaxial layer extending into the first opening and into the cavity and having an upper face extending mainly in a plane XY, A formation of at least one third opening in the second masking layer on a portion making it possible to expose a part of the upper face of the at least one first epitaxial layer, An epitaxial growth of at least one material made of the III-V material from the first epitaxial layer, the preferred direction of the growth being normal to the plane XY, so as to form at least one second epitaxial layer extending from the at least one first epitaxial layer.

The confinement during the growth of the first epitaxial layer, as well as the bent shape of the latter, makes it possible to avoid the propagation of the dislocations and to obtain a first epitaxial layer having a very low defect density, conducive to vertical growth, from this same first epitaxial layer, of a second thick epitaxial layer, and itself having hardly any defects. Thus, the method makes it possible to perform a vertical growth of a III-V material by avoiding the problems linked to the propagation of the dislocations.

According to another aspect, the invention relates to a microelectronic device, comprising a stack of layers in a vertical direction, said stack comprising, from a lower surface of said stack, a crystalline germination layer made of a III-V material, a first crystalline layer made of this same material and a second crystalline layer made of this same material, characterised in that the first crystalline layer has a zone which projects, projecting in the plane XY, with respect to the second layer.

Preferably, the first layer extends in a direction Z normal to the plane XY over a thickness $H_{110}$ and the second layer extends in this direction Z over a thickness $H_{120}$, with $H_{120} > 2*H_{110}$ and preferably $H_{120} > 3*H_{110}$. Preferably, the germination layer and the first epitaxial layer on the one hand, and the first epitaxial layer and the second epitaxial layer on the other hand, are in contact.

BRIEF DESCRIPTION OF THE FIGURES

The aims, objectives, as well as the features and advantages of the invention will best emerge from the detailed description of an embodiment of the latter, which is illustrated by the following accompanying drawings, wherein:

FIGS. 1 to 12 represent the main steps of an example of an embodiment.

FIG. 1 represents a stack comprising a crystalline layer of a III-V material, called germination layer and a first masking layer surmounting the germination layer.

FIGS. 2 to 12 show steps applied to the stack illustrated in FIG. 1. FIG. 12 illustrates an example of a structure that can be obtained, and which comprises a thick, epitaxial layer of III-V material.

FIGS. 13 and 14 illustrate an alternative embodiment, making it possible to reduce the risks of interfering doping of the epitaxial layer of III-V material.

FIGS. 15 and 16 illustrate unfavourable situations for the vertical electrical conduction and the confinement of defects which could occur during the growth of the first and of the second epitaxial layer respectively, when the method is not implemented.

FIGS. 17 and 21 illustrate different examples of shapes of sacrificial layers which could be adopted in the scope of the implementation of the method, these shapes making it possible to obtain varied epitaxial layer shapes of III-V material.

FIGS. 22 to 27 illustrate several embodiments to make power microelectronic components such as p-n diodes, or LEDs.

FIGS. 22 to 24 illustrate steps of producing a p-n diode.

FIGS. 25 to 27 illustrate steps specific to producing an LED.

The drawings are given as examples and are not limiting of the invention. They constitute principle schematic representations intended to facilitate the understanding of the invention and are not necessarily to the scale of practical applications. In particular, the dimensions and thicknesses of the different layers are not representative of reality.

DETAILED DESCRIPTION

Before starting a detailed review of embodiments of the invention, below optional features are stated which can optionally be used in association or alternatively:

According to a particular example, according to a cross-section parallel to the plane XY, the first opening has a dimension $L_{310}$ and the upper face of the first epitaxial layer has a dimension $L_{111}$, with $L_{111}>5*L_{310}$, preferably $L_{111}>10*L_{310}$ and preferably $L_{111}>20*L_{130}$. Advantageously, according to a cross-section parallel to the plane XY, the first opening extends over a surface $S_{310}$ and the upper face of the first epitaxial layer over a surface $S_{111}$, with $S_{111}>5*S_{310}$, preferably $S_{111}>10*S_{310}$ and preferably $S_{111}>20*S_{310}$. Thus, the dimension of the first opening is a lot smaller than the dimension of the first epitaxial layer. This makes it possible to avoid the propagation of the dislocations from the upper face of the germination layer until the first epitaxial layer.

Preferably, the first epitaxial layer has a thickness $H_{110}$ and the second epitaxial layer has a thickness $H_{120}$, with preferably $H_{120}>2*H_{110}$, preferably $H_{120}>3*H_{110}$ and preferably $H_{120}>5*H_{110}$, the thicknesses $H_{120}$ and $H_{110}$ being taken in a direction Z perpendicular to the plane XY. Thus, the thickness of the second epitaxial layer is a lot greater than the thickness of the first epitaxial layer. This makes it possible to avoid the propagation of dislocations in the first epitaxial layer, then to obtain a significant thickness of III-V material thanks to the second epitaxial layer.

According to an example, the plane XY is parallel to the upper face of the germination layer and to an upper face of the substrate.

According to a particular example, the method comprises, after the formation of the first epitaxial layer and before the removal of the second masking layer, a deposition of a third masking layer on the second masking layer, and a formation in the third masking layer of at least one fourth opening having sides and configured to expose a part of the second masking layer, the sides of the third masking layer being preserved during the growth of the second epitaxial layer from the first epitaxial layer. This makes it possible to confine the growth of the III-V material during the production of the second epitaxial layer.

Advantageously, the sides of the third masking layer having a height $H_{231}$ and the second epitaxial layer has a thickness $H_{120}$, such that $H_{231} \geq H_{120}$, the thicknesses $H_{231}$ and $H_{120}$ being taken in a direction Z perpendicular to the plane XY.

According to an embodiment, a protective layer is deposited at least on the sides of the third masking layer, and preferably on the sides defining the third opening of the second masking layer, before the step of growing the second epitaxial layer, this protective layer covering the sides of the third masking layer, and preferably the sides of the second masking layer, during the step of growing the second epitaxial layer. This makes it possible to avoid the involuntary diffusion of elements of the third masking layer until the second epitaxial layer. Thus, an involuntary doping of the second epitaxial layer is avoided.

According to an embodiment, after its etching, the sacrificial layer forms separate islands, each island extending from one single opening formed in the first masking layer.

According to a particular example, the cavity has a triangular sectional portion according to a cross-section parallel to the plane XY, said portion extending in vertical alignment with the first opening.

According to another embodiment, the growth of the first epitaxial layer is done in all the directions of the plane XY. According to an embodiment, the first opening is located in vertical alignment with a centre of the cavity. According to a particular example, the cavity is hexagonally-shaped.

According to an embodiment, the method also comprising the following steps:
  a doping from among an N-type or P-type doping of the first epitaxial layer,
  a doping of the other type from among an N-type or P-type doping of a second doped zone of the second epitaxial layer, the second doped zone extending from the upper face of the second epitaxial layer.

According to an example, at least one doping from among the P-type doping and the N-type doping is performed from acceptors and/or deep donors respectively. This makes it possible to increase the electrical resistivity of the second epitaxial layer. This embodiment in particular has its applications in the field of optically triggered high-voltage switches. A deep acceptor and deep donor are compounds having traps, of which the difference of energy level with the valence or conductive band respectively at least twice greater than the characteristic energy kT, k being the Boltzmann constant and T, the absolute temperature.

According to a particular example, the doping of the first epitaxial layer is performed during the deposition of this same layer.

According to an example, the doping of the second epitaxial layer is performed during the growth of this same layer.

According to an embodiment, the method further comprises:
  a production of a first electrode in electrical contact with the second epitaxial layer,
  a production of a second electrode in electrical contact with the first epitaxial layer.

According to an example, the stack forms a PN junction.

According to an embodiment, the method further comprises a formation of quantum wells within the second epitaxial layer, so as to manufacture an LED.

According to a particular example, the first electrode is deposited in a fifth opening made beforehand in the third masking layer and in the second masking layer so as to expose a part of the upper face of the first epitaxial layer and to make it accessible from an upper face of the third masking layer.

According to an example, the fifth opening is located in vertical alignment with the first opening.

According to an embodiment, the III-V material of the first epitaxial layer and the III-V material of the second epitaxial layer are materials III-N, and preferably are gallium nitride-based materials and preferably are made of gallium nitride.

According to an example, the III-V material of the first epitaxial layer and the III-V material of the second epitaxial layer are identical.

According to an example, the second epitaxial layer has several III-V materials. A portion of the second epitaxial layer in contact with the first epitaxial layer has a III-V material identical to that of the first epitaxial layer. Another portion of the second epitaxial layer which is not in contact with the first epitaxial layer has a II-V material different from that of the first epitaxial layer. This different III-V material can, for example, form a quantum well. Preferably, the materials of the first epitaxial layer and of the second epitaxial layer are made of the same material as that of the germination layer. Preferably, the material of the first epitaxial layer is identical to the material of the germination layer.

According to an embodiment, the steps of the method have the following features:
the first masking layer has a plurality of first openings, each exposing a part of the upper face of the germination layer,
the step of forming at least one sacrificial layer is carried out so as to form a plurality of sacrificial layers, separate from one another, each filling at least one first opening,
the second masking layer covers the plurality of sacrificial layers,
the step of forming at least one second opening is carried out so as to make a part of the upper face of each of the sacrificial layers accessible,
the step of forming at least one second opening is carried out so as to form a plurality of second openings, so as to make a part of the upper face of each sacrificial layer accessible,
the step of removing each sacrificial layer selectively with respect to the first masking layer and to the second masking layer, is carried out so as to form at least one plurality of cavities,
the step of epitaxially growing the III-V material from the germination layer is carried out so as to form a plurality of first epitaxial layers, each first epitaxial layer being located in a cavity,
the formation of at least one third opening is carried out so as to expose a part of the upper face of each first epitaxial layer,
the step of epitaxially growing the III-V material from at least one first epitaxial layer is carried out so as to form a second epitaxial layer extending from each first epitaxial layer.

Thus, a plurality of thick layers of III-V material is obtained, on one same substrate, by vertical epitaxy.

Advantageously, the first epitaxial layers are separate. Advantageously, the step of epitaxially growing the III-V material from each first epitaxial layer is carried out, such that the second epitaxial layers are separate.

According to an example, each second epitaxial layer is intended to form a microelectronic device, preferably a vertical device.

According to an example, the epitaxial growth of the III-V material from the germination layer is performed such that the first layer is epitaxial in the whole cavity. Thus, it fully fills the cavity.

The device can have at least any one of the optional features which can optionally be used in association or alternatively:

According to a particular example, the first epitaxial layer has a first doped zone, of N-type or of P-type doping, and the second epitaxial layer has on its surface, a second doped zone, of doping of the other type from among the N-type or the P-type.

According to an example, the stack partially forms at least one Schottky diode or one of a n-i-n, p-i-n or p-i-p diode, or also a MOSFET transistor.

According to a particular embodiment, the device comprises a first electrode in contact with the second doped zone, and a second electrode in contact with the first doped zone.

According to a particular example, the second epitaxial layer is surrounded by a fourth masking layer and the second electrode extends through the fourth masking layer and from an upper face of the fourth masking layer until the first doped zone.

In the present invention, the method is, in particular, dedicated to the manufacture of vertical microelectronic devices. This means that the growth of the material III-N is done in a favoured manner in a direction perpendicular to the plane of the lower face of the substrate, this direction corresponding to the axis Z of the orthogonal marker XYZ illustrated in FIG. 1.

It is specified that, in the scope of the present invention, the terms "on", "surmounts", "covers", "underlying", "opposite" and their equivalents do not necessarily mean "in contact with". Thus, for example, the deposition, the extension, the bonding, the assembly or the application of a first layer on a second layer, does not compulsorily mean that the two layers are directly in contact with one another, but means that the first layer covers at least partially the second layer by being either directly in contact with it, or by being separated from it by at least one other layer or at least one other element.

A layer can moreover be composed of several sublayers of one same material or of different materials.

In the description below, unless mentioned otherwise, when reference is made to qualifiers of absolute position, such as the terms "front", "rear", "top", "bottom", etc., or relative position, such as the terms "above", "below", "upper", "lower", etc., or to orientation qualifiers, such as the terms "horizontal", "vertical", "lateral", etc., reference is made to the orientation of the corresponding figures, being understood that, in practice, the devices and assemblies described can be oriented differently.

Likewise, when it is indicated that an element is located to the right of another element, this means that these two elements are located on one same line perpendicular to the main plane, wherein a face of the substrate mainly extends, i.e. on one same line oriented vertically in the figures. An element located "in vertical alignment with" or "to the right" of another element means that these two elements are both located on one same line perpendicular to a plane wherein a lower or upper face of a substrate mainly extends.

The terms "substantially", "about", "around" mean "within 10%, preferably within 5%" or, when this is an angular orientation "within 10°". Thus, a direction substantially normal to a plane means a direction having an angle of 90±10° with respect to the plane.

A portion or an element qualified as "sacrificial", means that this element is intended to be "sacrificed", i.e. removed during a subsequent method step.

By a substrate, a layer, a device "made" of a material M, this means a substrate, a layer, a device comprising this material M only, or this material M and optionally other materials, for example alloy elements, impurities or doping elements. Thus, a material made of a material III-N can comprise a material III-N added with dopants. Likewise, a GaN-based layer typically comprises GaN and AlGaN or InGaN alloys.

The term "III-V material" makes reference to a semiconductor composed of one or more elements of the column III and of the column V of the Mendeleevs periodic table. Among the elements of the column III, there are boron, gallium, aluminium or also indium. The column V contains, for example, nitrogen, arsenic, antimony and phosphorous.

By "selective etching vis-à-vis" or "etching having a selectivity vis-à-vis", this means an etching configured to remove a material A or a layer A vis-à-vis a material B or a layer B, and having an etching speed of the material A greater than the etching speed of the material B. The selectivity is the ratio between the etching speed of the material A and the etching speed of the material B. The selectivity between A and B is referenced $S_{A:B}$.

A preferably orthonormal marker, comprising the axes x, y, z is represented in FIG. 1. This marker is applicable by extension to the other figures.

In the present patent application, thickness will preferably be referred to for a layer and height for a structure or a device. The thickness is taken in a direction normal to the main extension plane of the layer, and the height is taken perpendicularly to the base plane XY. Thus, a layer typically has a thickness along z, when it extends mainly along a plane XY, and a projecting element, for example an insulation trench, has a height along z. The relative terms "on", "under", "underlying" preferably refer to positions taken in the direction z.

The steps of the method such as claimed extend to the broad sense and can optionally be carried out in several substeps.

An example of an embodiment will now be described in reference to FIGS. 1 to 10. This method makes it possible to obtain the structure illustrated in FIG. 10, and which comprises a layer 120 made of III-V material being thick in the direction Z of the orthogonal marker XYZ illustrated in FIG. 1.

FIG. 1 illustrates a stack 1 comprising a crystalline layer of a III-V material called germination layer 100 and a first masking layer 210 surmounting the germination layer 100.

The germination layer 100 is, for example, made of or is GaN-based. It has an upper face 101 which extends mainly in a plane XY of the orthogonal marker XYZ.

The first masking layer 210 can, for example, be made of SiN. It can be deposited by chemical vapour deposition (CVD).

Advantageously, the stack 1 also comprises a substrate 10 to mechanically support the germination layer 100. This substrate 10 can also be referenced support or support substrate. This substrate 10 is, for example, silicon-based or is made of silicon to reduce the costs and to facilitate the compatibility of the method with the usual equipment and technologies of the microelectronics industry. In the latter case, it can be presented in the form of a wafer, the diameter of which is, for example, 200 mm or 300 mm. The substrate 10 can also be made of sapphire, or also made of SiC.

In certain cases, it can be provided to have a buffer layer 20 between the substrate 10 and the germination layer 100, also called nucleation layer. This buffer layer 20 can be any layer known to a person skilled in the art, enabling the nucleation and the growth of the material constituting the germination layer 100. The buffer layer 20 is preferably AlN-based. It can alternatively be made of other metal nitrides of type for example AlGaN-based. Furthermore, this buffer layer 20 can serve to avoid undesired reactions between the substrate 10 and the germination layer 100. For example, if the substrate 10 is made of Si and the germination layer 100 is made of GaN, it is necessary to provide a buffer layer 20, for example, an AlN layer, in order to avoid the appearance of the meltback etching phenomenon, which appears due to the high reactivity between silicon and gallium at a high temperature.

As illustrated in FIG. 2, a step comprises the production of at least one first through opening 310, made in the masking layer 210 so as to expose a part 102 of the upper face 101 of the germination layer 100.

This first opening 310 can be formed by first proceeding with a UV (ultraviolet) or DUV (Deep UV) lithography, electronic beam lithography, or NIL (Nanoimprint lithography) step, then for example with an anisotropic etching, this etching being able to be a dry or wet etching. For example, it can be a chlorinated or fluorocarbon chemistry dry etching step.

As illustrated in FIG. 2 also, then the deposition of a sacrificial layer 30 is provided, which covers the upper face 211 of the masking layer 210 and which fills the opening 310, preferably which fully fills the opening 310. Preferably, this sacrificial layer 30 comes into contact with the upper face 101 of the germination layer 100.

The sacrificial layer 30 can be made of $SiO_2$, SiN, poly Si, SiGe, TiN or made of at least one of these materials. The deposition of this sacrificial layer 30 can initially be done full plate, by low pressure chemical vapour deposition (LPCVD), or by plasma-enhanced chemical vapour deposition (PECVD).

As illustrated in FIG. 3, the sacrificial layer 30 is then etched, such that this layer extends over only one part of the first masking layer 210, and this from the opening 310.

More specifically, on one same plate corresponding to the structure illustrated in FIG. 1, after its etching, the sacrificial layer 30 forms separate islands, each island extending from at least one opening 310 formed in the first masking layer 210.

In other words, and as illustrated in the figures, according to this example of an embodiment, each island extends from one single opening 310 formed in the first masking layer 210.

According to an alternative embodiment, each island formed by the sacrificial layer 30 extends from several openings 310 formed by the first masking layer 210.

Naturally, the structure illustrated in FIG. 3 can be reproduced numerous times on the surface of the germination layer 100. Thus, from the step illustrated in FIG. 3, a plurality of separate sacrificial layers will be present on one same plate. The steps which will be described below will be applied to each of these sacrificial layers.

As illustrated in FIG. 4, a second masking layer 220 is then deposited on the upper face 211 of the first masking layer 210 and on the upper face 31 of the sacrificial layer 30. The second masking layer 220 has an upper face 221 which extends mainly in a plane parallel to the plane XY of the orthogonal marker XYZ.

Like the first masking layer 210, the second masking layer 220 can be made of SiN, or of another material, which will not be etched during the removal of the sacrificial layer. It can be deposited by chemical vapour deposition CVD. Advantageously, the second masking layer 220 is made of the same material as the first masking layer 210. This makes it possible to obtain a homogenous environment for the growth of the first epitaxial layer which will be described below and therefore to obtain a homogenous growth. This also makes it possible to simplify the manufacturing process.

As illustrated in FIG. 5, a step comprises the manufacture of at least one second opening 320 made in the second masking layer 220 so as to expose a part 32 of the upper face 31 of the sacrificial layer 30.

The second opening 320 can be formed by first proceeding with a UV or DUV lithography, electronic beam lithography, or also ML step, then for example with an anisotropic etching step, this etching being able to be a dry or wet etching. For example, it can be a chlorinated or fluorocarbon dry etching step.

As illustrated in FIG. 6, a step then comprises the removal of the sacrificial layer 30 while preserving the first masking layer 210 and the second masking layer 220.

The material constituting the sacrificial layer 30 must therefore be chosen such that it has a good selectivity to the etching with respect to the material of the first masking layer 210 and to the material of the second masking layer 220 during the removal of said sacrificial layer 30. If the first masking layer 210 or the second masking layer 220 is produced, as given as an example, made of SiN, it is therefore excluded from producing the sacrificial layer 30 in this same material. For example, if the first masking layer 210 or the second masking layer 220 is made of SiN, it can be provided to produce the $SiO_2$-based sacrificial layer 30 or made of $SiO_2$ only.

The removal of the sacrificial layer 30 selectively with respect to the first masking layer 210 and to the second masking layer 220 can be done by wet isotropic etching from the second opening 320. It is possible to use an HF solution for a sacrificial layer made of $SiO_2$. Preferably, the etching of the sacrificial layer 30 is selective with respect to the germination layer 100. A dry isotropic etching is also possible.

This removal makes it possible to form a cavity 40 intended for the growth of a first epitaxial layer 110 of the III-V material such as illustrated in FIG. 7. This cavity 40 extends from the germination layer 100 through the first opening 310. Thus, this growth is done from the part 102 of the upper face 101 of the exposed germination layer 100 thanks to the first opening 310.

The first epitaxial layer 110 can be manufactured by metalorganic vapour phase epitaxy (MOVPE), sometimes called metalorganic chemical vapour deposition (MOCVD). The gallium source in the form of metalorganic precursor (precursor III) can typically be trimethyl-gallium (TMGa) or triethyl-gallium (TEGa). The nitrogen source can typically be ammoniac ($NH_3$) (precursor V). The growth temperature is preferably greater than 600° C., for example around 1000° C. The gas pressure within the growth reactor is, for example, around 100 Torr (1 Torr=133322 Pa=133322 $kg·m^{-1}·s^{-2}$). The growth is done preferably in a neutral and/or reducing atmosphere, typically by adding nitrogen $N_2$ and/or dihydrogen $H_2$. The flows of the different gases can be adapted in a manner known to a person skilled in the art, in particular according to the volume of the reactor.

The first epitaxial layer 110 can alternatively be manufactured by molecular beam epitaxy (MBE), by hydride vapour phase epitaxy (HVPE) or by chemical vapour deposition (CVD).

During the growth of the first epitaxial layer 110, the latter is vertically blocked by the cavity ceding 40, which is formed by the lower face 222 of the second masking layer 220. The first epitaxial layer 110 therefore favourably grows laterally, in a direction parallel to the plane XY. This makes it possible to reach a high growth speed, and this without increasing the thickness of the first epitaxial layer 110. The upper face of the first epitaxial layer 111 extends mainly in a plane parallel to the plane XY.

In the advantageous embodiment, wherein each island of the sacrificial layer 30 extends from one single opening 310 formed in the first masking layer 210, the cavity 40 only communicates with one single opening 310 in the masking layer 210. The growth of the first epitaxial layer 110 in a cavity 40 is therefore done from one single part 102 of the upper face 101 of the germination layer 100, as illustrated in FIG. 7. For a cavity 40, there is thus one single growth front, or epitaxy front. This avoids the presence of one even several coalescence joints due to the meeting of epitaxy fronts coming from different parts 102 of the upper face 101. Such a coalescence joint could indeed cause structural defects in the first epitaxial layer 110. This embodiment therefore makes it possible to further reduce the number of defects in the first epitaxial layer 110.

Advantageously, the second opening 320 exposes a part 32 of the upper face 31 of the sacrificial layer 30 extended from the zone of the sacrificial layer 30 located in vertical alignment with the first opening 310. Preferably, this part 32 exposed from the sacrificial layer 30 is located at the end opposite the upper face 31 of the sacrificial layer 30 with respect to the zone of the sacrificial layer 30 in vertical alignment with the first opening 310. The more the second opening 320, which enables access to the cavity 40 left after the removal of the sacrificial layer 30 for the growth of the first epitaxial layer 110, is extended from the first opening 310, which enables access to the germination layer 100, the more the proportion of the first epitaxial layer 110 increases which grows by being confined in all the directions of the space, apart from in the plane XY. Producing the second opening 320 at the end opposite the upper face 31 of the sacrificial layer 30 with respect to the zone of the sacrificial layer 30 in vertical alignment with the first opening 310 therefore makes it possible to make the first epitaxial layer 110 grow in a confined manner almost fully.

In the method according to the invention, the start of the growth is done at the first opening 310 exposing the part 102 of the upper face 101 of the germination layer 100, and not over the whole of the upper face 101 of the germination layer 100. The surface area of the start zone is therefore limited. Yet, as mentioned above, the germination layer 100, of which the growth has been done from a typically silicon substrate, has a very high density of dislocations or induces a high density of dislocations at the Si/III-V material interface. Limiting the surface area of the start zone therefore makes it possible to limit the number of defects which can propagate in the first epitaxial layer 110. Furthermore, the growth of the first epitaxial layer 110 being mainly in the plane XY, this make is possible to reduce, even remove the propagation of dislocations in this first epitaxial layer 110. More specifically, the dislocations formed at the interface between the germination layer 100 and the epitaxial material in the first opening 310, do not propagate laterally in the plane XY and therefore in the first epitaxial layer 110. Furthermore, the bent shape given to the cavity 40 by the method according to the invention makes it possible to limit the propagation of the dislocations. Thus, the first epitaxial layer 110 has a very low density of dislocations.

As illustrated in FIG. 9, a step then comprises the removal of a part of the second masking layer 220 making it possible to expose a part 112 of the upper face 111 of the first epitaxial layer 110, thus forming a third opening 330. The dimensions of this removal define the dimensions in the plane XY of the second epitaxial layer 120. Preferably, the zone of the upper face 111 of the first epitaxial layer 110 in vertical alignment with the first opening 310 is not exposed by the opening 330. Advantageously, and as will be detailed below in reference to FIGS. 26 and 27, this makes it possible to facilitate a contact at the first epitaxial layer, from a front face of the device opposite this first epitaxial layer.

Following the formation of the opening 330, an epitaxy step is provided, illustrated in FIG. 10, making it possible to produce a second epitaxial layer 120. This second epitaxial layer 120 can be manufactured by the same methods as the first epitaxial layer 110. The growth is done from the part 112 of the upper face 111 of the first epitaxial layer 110. As mentioned above, this first epitaxial layer 110 has a low density of dislocations. Due to this, few dislocations are propagated at the second epitaxial layer 120 during its growth. The second epitaxial layer 120 therefore itself has a very low density of dislocations.

Preferably, the materials and precursors used for the growths of the first 110 and second 120 epitaxial layers are identical. However, it will be noted that dopants can be added in a part or in all of only one of these two layers 110, 120. Such is, for example, the case if it is sought to produce, in whole or in part from the first epitaxial layer, a doping of P- or N-type, and that it is sought to produce, in whole or in part from the second epitaxial layer, an inverse doping. Likewise, such is also the case if it is sought to form an active zone comprising quantum wells within the second epitaxial layer.

According to an embodiment, along a cross-section parallel to the plane XY, the first opening 310 has a dimension called $L_{310}$ and the upper face 111 of the first epitaxial layer 110 has a dimension called $L_{111}$, with $L_{111}>5*L_{310}$, preferably $L_{111}>10*L_{310}$ and preferably $L_{111}>20*L_{310}$. The dimensions $L_{111}$ and $L_{310}$ are the maximum dimensions of these openings. Thus, for openings having a circular shape in the plane XY, these dimensions correspond to the diameter. For openings having a polygonal shape in the plane XY, these dimensions correspond to the largest diagonal. Thus, the dimension of the first opening is a lot less than the dimension of the first epitaxial layer. This makes it possible to avoid the propagation of the dislocations from the upper face 102 of the germination layer 100 until the first epitaxial layer 110.

According to an embodiment, along a cross-section parallel to the plane XY, the first opening 310 has a surface called $S_{310}$ and the upper face 111 of the first epitaxial layer 110, a surface called $S_{111}$, with $S_{111}>5*S_{310}$, preferably $S_{111}>10*S_{310}$ and preferably $S_{111}>20*S_{310}$.

According to an embodiment, the first epitaxial layer 110 has a thickness $H_{110}$ and the second epitaxial layer 120 has a thickness $H_{120}$, with $H_{120}>1.5*H_{110}$, preferably $H_{120}>3*H_{110}$ and preferably $H_{120}>5*H_{110}$. Thus, the thickness of the second epitaxial layer 120 is a lot greater than the thickness of the first epitaxial layer 110. This makes it possible to avoid the propagation of the dislocations in the first epitaxial layer 110, then to obtain a significant thickness of III-V material thanks to the second epitaxial layer 120.

FIGS. 8, 11 and 12 illustrate an optional example.

The step illustrated in FIG. 8 carried out following the steps described in reference to FIGS. 1 to 7. As illustrated in FIG. 8, after the growth of the first epitaxial layer 110 and before the growth of the second epitaxial layer 120, a third masking layer 230 is deposited on the upper face 221 of the second masking layer 220. Preferably, this third masking layer 230 is also deposited before the production of the opening 330.

The step illustrated in FIG. 11 carried out following the step illustrated in FIG. 8. As illustrated in FIG. 11, in this embodiment, a step then comprises the removal of a part of the third masking layer 230 making it possible at least to expose the part 112 of the upper face 111 of the first epitaxial layer 110 and forming an opening 340. Preferably, the fourth opening 340 is located precisely in vertical alignment with the third opening 330, as illustrated in FIG. 11. Advantageously, the manufacture of the third opening 330 and that of the fourth opening 340 is done simultaneously.

As illustrated in FIG. 12, the growth of the second epitaxial layer 120 is thus limited in the plane XY by the sides 231 of the third masking layer 230. This makes it possible to laterally constrain the growth, therefore, to control more specifically the dimensions of the second epitaxial layer 120 and consequently, better control the dimensions of the vertical device made from this second epitaxial layer 120. This therefore makes it possible to avoid a laterally uncontrolled growth of the second epitaxial layer 120. In particular, this makes it possible to avoid that second layers 120, adjacent, but that are sought to be separate, as intended to form separate components on one same plate, not in contact. The masking layer 230 thus acts as an insulator between the adjacent second layers 120.

According to an embodiment, the sides 231 of the third masking layer 230 have a height $H_{231}$ such that $H_{231} \geq H_{120}$.

FIGS. 13 and 14 illustrate an optional embodiment. According to this embodiment, a protective layer 50 is deposited on the sides 231 of the third masking layer 230 and on the sides 223 of the second masking layer 220 before the growth of the second epitaxial layer 120. The deposition of this protective layer 50 can initially be done full plate, by LPCVD, by PECVD, by atomic layer deposition (ALD), or also by plasma-enhanced atomic layer deposition (PEALD). The part of the protective layer 50 covering the upper face 111 of the first epitaxial layer 110 is then removed to expose the latter. This removal is done preferably by dry or ion etching. Advantageously, a subsequent step of cleaning the upper surface 111 of the first epitaxial layer 110 is provided. The protective layer 50 acts as a barrier preventing the diffusion of atoms of the second masking layer 220 or of the third masking layer 230 in the second epitaxial layer 120 during the growth of the latter. This makes it possible to avoid an unintentional doping of the second epitaxial layer 120. Preferably, the protective layer 50 is made of $Al_2O_3$.

FIGS. 15 and 16 illustrate an unclaimed method, different from that above and which does not provide to make the first epitaxial layer grow within a cavity having a ceiling formed by the lower face 222 of the second masking layer 220. In this case, the growth of the first epitaxial layer 110 is not vertically blocked and is not therefore constrained to progress in the plane XY. It therefore grows at a distance from the first masking layer 100. This does not make it possible to satisfactorily block the dislocations in the second epitaxial layer 120.

FIGS. 17 to 21 illustrate different cavity shapes and layer shape obtained by epitaxy. Each of these figures illustrate, as a top view, a structure obtained from the step of forming the first epitaxial layer 110 and before the production of the opening 330 in the second masking layer 220. In these examples, to facilitate the explanation, it is considered that the first 210 and the second 220 masking layers 220 are transparent. The textures used in these figures thus make it possible to observe the first epitaxial layer 110 either directly, or by transparency through the second masking layer 220.

According to an embodiment represented in FIG. 17, the cavity 40 has, in the plane XY, the shape of two juxtaposed rectangles, one in vertical alignment with the first opening 310 and the second, of larger dimensions, extending from one of the edges of the first rectangle. This shape makes it possible to guide the growth of the first epitaxial layer 110 in a first zone even more confined in the plane XY, before letting it extend further laterally, thus ensuring a very low propagation of the dislocations.

According to another embodiment illustrated in FIG. 18, the cavity 40 has, always in the plane XY, a funnel-shaped expanding by extending from the first opening 310. This shape makes it possible to guide the growth of the first epitaxial layer 110 in a first zone, also very confined in the plane XY, then in a second zone of increasing width. This has the effect of avoiding a sudden change in dimension and the generation of growth defects which is linked to this.

According to another embodiment represented in FIG. 19, the shape of the sacrificial layer 30 makes it possible to give to the cavity 40 and therefore to the first epitaxial layer 110, a rectangular shape in the plane XY.

According to other embodiments illustrated in FIGS. 20 and 21, the growth of the first epitaxial layer 110 is done in all the directions of the plane XY. Preferably, the first opening 310 is thus at the centre of the cavity 40 or at the very least, at a distance from the edges of the cavity 40. Thus, the first epitaxial layer 110 can grow from the first opening 310 in several directions of the plane XY, preferably in all the directions of the plane XY. For example, the cavity 40 has a hexagonal shape along a section XY. It ca also have a circular shape along a section XY. The first epitaxial layer 110 grows until coming into contact with the edges 41 of the cavity 40, which imposes its shape on it along a section XY. In these embodiments where the growth of the first epitaxial layer 110 is done in all the directions of the plane XY, it is necessary that the portion 224 of the second masking layer 220 confining the growth of the first epitaxial layer 110 in the direction z and the rest of the second masking layer 220 are continuous, in order to ensure the holding of the portion 224 in its initial position during the removal of the sacrificial layer 30. Thus, preferably, it is provided that the portion 224 of the second masking layer 220 is connected to the rest of the second masking layer 220 by parts of the second masking layer 220 not represented in FIGS. 20 and 21 for clarity. Thus, the growth is done so as to form bridges which connect the central islands and the peripheral regions which surround the islands.

Another aspect of the invention relates to components which could be obtained by the method, which is the subject matter of the invention, as well as other usual microelectronic manufacturing steps. FIGS. 22 to 27 illustrate these components, as well as steps which enable the embodiment.

FIGS. 22 to 24 illustrate an example for producing a first component. This component comprises a germination layer 100 made of a III-V material, a first epitaxial layer 110 of the same material having a bent shape in a plane normal to the plane XY, and a second epitaxial layer 120 being very thick in the direction z of the orthogonal marker XYZ illustrated in FIG. 22, the germination layer 100 and the first epitaxial layer 110 on the one hand, and the first epitaxial layer 110 and the second epitaxial layer 120 on the other hand, being in contact. The germination layer 100, the first epitaxial layer 110 and the second epitaxial layer 120 form an assembly 130 constituted of the same III-V material.

According to an embodiment, the component has a first doped zone 1001, of N-type or P-type doping. This doped zone 1001 extends in at least one part of the first epitaxial layer 110, preferably, from the face of the first epitaxial layer in contact with the first masking layer 210. This doped zone 1001 can extend over only one part or over all of the thickness of the first epitaxial layer 110. It can also be provided that this doped zone 1001 also extends in a part of the second epitaxial layer 120 which extends from the first epitaxial layer 110.

The second epitaxial layer 120 has a second doped zone 1002, of doping of the other type from among the N type or the P type. The second doped zone 1002 is located at an upper end of the second epitaxial layer 120 opposite a lower end which is in contact with the first epitaxial layer 110. The second doped zone 1002 extends preferably from the surface 121 of the second epitaxial layer 120. Preferably, the first doped zone 1001 and the second doped zone 1002 have thicknesses in the direction Z between 2 µm and 20 µm, preferably between 5 and 15 µm, and between 50 nm and 2 µm, preferably between 100 nm and 500 nm, respectively.

The component comprises a first electrode 2001 on the surface of the second doped zone 1002. Fully conventionally, this first electrode 2001 can be formed by depositing a metal on the surface 121 of the second epitaxial layer 120. This deposition can be conform. Then, a flattening of this layer is performed, for example by chemical-mechanical polishing (CMP). Advantageously, it is provided that this flattening forms a flat surface formed by the first electrode 2001 and by a fourth masking layer 240 surrounding the second epitaxial layer 120. The fourth masking layer 240 can optionally be constituted of several masking layers, as indicated above in reference to FIG. 12, where the fourth masking layer 240 is constituted of the second masking layer 220 and of the third masking layer 230. The result of these steps is illustrated in FIG. 23.

The component comprises a second electrode 2022 in contact with the first doped zone 1001. For this, the following steps can be carried out:
fixing of a handle substrate 5000 on the face comprising the first electrode 2001,
return of the stack such that the substrate 10 is oriented upwards,
removal of the substrate 10, of the optional buffer layer 20 and of the germination layer 100. These removals can be, for example, performed by CMP, by mechanical thinning or grinding, or also dry or wet etching.
deposition of a metal electrode 2002 on the first doped zone 1001.

The result obtained from these steps is illustrated in FIG. 24. For example, it enables the production of a P-N diode.

FIG. 25 illustrates another component, typically an LED. According to this embodiment, the component comprises an active zone 3000. This active zone 3000 typically comprises a plurality of quantum wells. Conventionally, in these layers, an electron will be recombined with a hole by emitting a given energy photon. These photons form the light radiation of wavelength λ. The active zone 3000 comprises, for example, or is constituted by a stack of one or more emissive layers, each forming a quantum well, for example GaN-, InN-, InGaN-, AlGaN-, AlN-, AlInGaN-, GaP-, AlGaP-, AlInGaP-, AlGaAs-, GaAs-, InGaAs-, AlInAs-based, or a combination of one or more of these materials. Preferably, the material of the second epitaxial layer 120 is made of the material of the first epitaxial layer 110, i.e. this means that the material of the second epitaxial layer 120 is identical to the material of the first epitaxial layer 110, except for dopants incorporated at the active zone 3000 comprising the quantum wells. As a variant, the active zone 3000 can be an intrinsic gallium nitride layer, i.e. unintentionally doped, for example of residual donor concentration between $10^{15}$ and $10^{18}$ atoms/cm$^3$, for example around $10^{17}$ atoms/cm$^3$.

The active zone 3000 can be formed during the epitaxial growth of the second epitaxial layer 120. Except for this doping, the steps of producing this component are thus identical to those described in reference to FIGS. 22 to 24. The component obtained thus forms an LED.

According to another example illustrated in FIGS. 26 and 27. In this embodiment, the first doped zone 1001 has a shape such that it enables a contact in vertical alignment with it. More specifically, in this embodiment, the second electrode 2002 has been produced in an opening 350, itself made in a fourth masking layer 240 surrounding the second epitaxial layer 120. It can be fully considered that instead of the fourth masking layer 240, the confinement of the second epitaxial layer 120 is ensured by a second 220 and a third 230 masking layer as described above in reference to FIGS. 12 and 14. This opening 350 thus forms a via which makes the first doped zone 1001 accessible from the face opposite the structure, for example from an upper face 232 of the fourth masking layer 240. This contact is made in a zone 113 of the first epitaxial layer 110 which projects with respect to the sides of the second epitaxial layer 120, along a projection of these two layers over a plane XY. This zone 113 is illustrated in FIG. 27. The dimension of this zone 113, taken in the plane XY is sufficient to enable a contact, while preserving a portion of the electrically insulating material of the masking layer 240/230, this in order to ensure a good insulation between the electrode 2002 and the second epitaxial layer 120. Such a contact makes it possible that the two electrodes of the device are located on the same side of the device. This can be useful in certain architectures and facilitates the treatment of the plates on which the device is located.

According to another non-illustrated embodiment, the component comprises one single doped zone, of N-type or of P-type doping, extending in a part of all of the second epitaxial layer 120, from the surface 121 of the second epitaxial layer. It can also be provided that this single doped zone also extends in a part of the first epitaxial layer 110 which extends from the second epitaxial layer 120. The component thus obtained can be intended to manufacture a Schottky diode, an n-i-n, p-i-n or p-i-p diode or also a MOSFET transistor.

Through the different embodiments described above, it appears clearly that the invention proposes an effective solution to make a thick layer of III-V material vertically grow.

The invention is not limited to the embodiments described above and extends to all embodiments covered by its scope.

The invention claimed is:

1. A method for growing a III-V material, the method comprising:
    on a stack comprising a crystalline layer comprising the III-V material, as a germination layer, a first masking layer surmounting the germination layer, the first masking layer comprising a first opening exposing a part of an upper face of the germination layer, forming at least one sacrificial layer filling the first opening and extending from the first opening on at least one first region of an upper face of the first masking layer;
    depositing a second masking layer, covering an upper face of the sacrificial layer, and covering at least one second region of the upper face of the first masking layer, the second region being uncovered by the sacrificial layer;
    forming at least one second opening in the second masking layer, so as to make a part of the upper face of the sacrificial layer accessible;
    removing the sacrificial layer selectively with respect to (i) the first masking layer and to (ii) the second masking layer, so as to form at least one cavity;
    epitaxially growing a first material comprising the III-V material from the germination layer in the first opening and in the cavity, so as to form at least one first epitaxial layer extending in the first opening and in the cavity and having an upper face extending mainly in an XY-plane;
    forming at least one third opening in the second masking layer on a portion making it possible to expose a part of the upper face of the at least one first epitaxial layer; and
    epitaxially growing at least one second material comprising the III-V material from the first epitaxial layer, so as to form at least one second epitaxial layer extending from the at least one first epitaxial layer,
    wherein the first epitaxial layer has a thickness, H110, and the second epitaxial layer has a thickness, H120, H110 and H120 being measured in the vertical direction, perpendicular to the XY-plane, and $$H120 > 2 \times H110.$$

2. The method of claim 1, wherein along a cross-section parallel to the XY-plane, the first opening has a dimension, L310, and the upper face of the first epitaxial layer has a dimension, L111, and
    wherein $L111 > 5 \times L310$.

3. The method of claim 1, further comprising, after the forming of the first epitaxial layer and before the forming of the third opening in the second masking layer:
    depositing a third masking layer on the second masking layer; and
    forming, in the third masking layer, at least one fourth opening having sides and configured to expose a part of the second masking layer,
    wherein the sides of the third masking layer are preserved, during the epitaxially growing of the at least one second epitaxial layer, from the first epitaxial layer.

4. The method of claim 3, further comprising:
    depositing a protective layer at least on the sides of the third masking layer, before the epitaxially growing of the at least one second epitaxial layer, the protective layer covering the sides of the third masking layer, during the epitaxially growing of the at least one second epitaxial layer.

5. The method of claim 1, wherein the cavity has a portion of triangular section along a cross-section parallel to the XY-plane, and
wherein the portion extends in vertical alignment with the first opening.

6. The method of claim 1, wherein the epitaxially growing of the first epitaxial layer is done in all the directions of the XY-plane.

7. The method of claim 6, wherein the first opening is located in vertical alignment with a center of the cavity.

8. The method of claim 6, wherein the cavity is hexagonally-shaped.

9. The method of claim 1, further comprising:
N-type or P-type doping the first epitaxial layer; and
doping of the other type from the N-type or P-type doping of a second doped zone of the second epitaxial layer, the second doped zone extending from the upper face of the second epitaxial layer.

10. The method of claim 9, further comprising:
producing a first electrode in electrical contact with the at least one second epitaxial layer; and
producing a second electrode in electrical contact with the first epitaxial layer.

11. The method of claim 10, wherein the stack forms a PN junction.

12. The method of claim 10, further comprising:
forming one or more quantum wells within the second epitaxial layer, so as to manufacture an LED.

13. The method of claim 10, further comprising, after the forming of the first epitaxial layer and before the forming of the third opening in the second masking layer:
depositing a third masking layer on the second masking layer; and
forming, in the third masking layer, at least one fourth opening having sides and configured to expose a part of the second masking layer,
wherein the sides of the third masking layer are preserved, during the epitaxially growing of the at least one second epitaxial layer, from the first epitaxial layer,
wherein the first electrode is deposited in a fifth opening, produced beforehand in the third masking layer and in the second masking layer, so as to expose a part of the upper face of the first epitaxial layer and to make it accessible from an upper face of the third masking layer.

14. The method of claim 1, wherein the III-V material of the first epitaxial layer and the III-V material of the second epitaxial layer are III-N materials.

15. The method of claim 1, wherein the first masking layer has a plurality of first openings, each exposing a part of the upper face of the germination layer,
wherein the forming of the at least one sacrificial layer is carried out so as to form a plurality of sacrificial layers, separate from one another, each filling at least one first opening,
wherein the second masking layer covers the plurality of sacrificial layers,
wherein the forming of the at least one second opening is carried out so as to make a part of the upper face of each of the sacrificial layers accessible,
wherein the forming of the at least one second opening is carried out so as to form a plurality of second openings, so as to make a part of the upper face of each sacrificial layer accessible,
wherein the removing if each sacrificial layer selectively at the first masking layer and at the second masking layer, is carried out so as to form at least one plurality of cavities,
wherein the epitaxially growing of the III-V material from the germination layer is carried out so as to form a plurality of the first epitaxial layer, each first epitaxial layer being located in a cavity,
wherein the forming of the at least one third opening is done so as to expose a part of the upper face of each first epitaxial layer, and
wherein the epitaxially growing of the III-V material from the at least one first epitaxial layer is carried out so as to form a second epitaxial layer extending from each first epitaxial layer.

16. A method for growing a III-V material, the method comprising:
on a stack comprising a crystalline layer comprising the III-V material, as a germination layer, a first masking layer surmounting the germination layer, the first masking layer comprising a first opening exposing a part of an upper face of the germination layer, forming at least one sacrificial layer filling the first opening and extending from the first opening on at least one first region of an upper face of the first masking layer;
depositing a second masking layer, covering an upper face of the sacrificial layer, and covering at least one second region of the upper face of the first masking layer, the second region being uncovered by the sacrificial layer;
forming at least one second opening in the second masking layer, so as to make a part of the upper face of the sacrificial layer accessible;
removing the sacrificial layer selectively with respect to (i) the first masking layer and to (ii) the second masking layer, so as to form at least one cavity;
epitaxially growing a first material comprising the III-V material from the germination layer in the first opening and in the cavity, so as to form at least one first epitaxial layer extending in the first opening and in the cavity and having an upper face extending mainly in an XY-plane;
forming at least one third opening in the second masking layer on a portion making it possible to expose a part of the upper face of the at least one first epitaxial layer; and
epitaxially growing at least one second material comprising the III-V material from the first epitaxial layer, so as to form at least one second epitaxial layer extending from the at least one first epitaxial layer,
wherein the first masking layer has a plurality of first openings, each exposing a part of the upper face of the germination layer,
wherein the forming of the at least one sacrificial layer is carried out so as to form a plurality of sacrificial layers, separate from one another, each filling at least one first opening,
wherein the second masking layer covers the plurality of sacrificial layers,
wherein the forming of the at least one second opening is carried out so as to make a part of the upper face of each of the sacrificial layers accessible,
wherein the forming of the at least one second opening is carried out so as to form a plurality of second openings, so as to make a part of the upper face of each sacrificial layer accessible, wherein the removing if each sacrificial layer selectively at the first masking layer and at the second masking layer, is carried out so as to form at least one plurality of cavities, wherein the epitaxially growing of the III-V material from the germination layer is carried out so as to form a plurality of the first epitaxial layer, each first epitaxial layer being located in a cavity, wherein the forming of the at least one third opening is done so as to expose a part of the upper face of each first epitaxial layer, and wherein the epitaxially growing of the III-V material from the at least one first epitaxial layer is carried out so as to form a second epitaxial layer extending from each first epitaxial layer.

17. A method for growing a III-V material, the method comprising:

on a stack comprising a crystalline layer comprising the III-V material, as a germination layer, a first masking layer surmounting the germination layer, the first masking layer comprising a first opening exposing a part of an upper face of the germination layer, forming at least one sacrificial layer filling the first opening and extending from the first opening on at least one first region of an upper face of the first masking layer;

depositing a second masking layer, covering an upper face of the sacrificial layer, and covering at least one second region of the upper face of the first masking layer, the second region being uncovered by the sacrificial layer;

forming at least one second opening in the second masking layer, so as to make a part of the upper face of the sacrificial layer accessible;

removing the sacrificial layer selectively with respect to (i) the first masking layer and to (ii) the second masking layer, so as to form at least one cavity;

epitaxially growing a first material comprising the III-V material from the germination layer in the first opening and in the cavity, so as to form at least one first epitaxial layer extending in the first opening and in the cavity and having an upper face extending mainly in an XY-plane;

forming at least one third opening in the second masking layer on a portion making it possible to expose a part of the upper face of the at least one first epitaxial layer; and epitaxially growing at least one second material comprising the III-V material from the first epitaxial layer, so as to form at least one second epitaxial layer extending from the at least one first epitaxial layer, and (a) after the forming of the first epitaxial layer and before the forming of the third opening in the second masking layer:

depositing a third masking layer on the second masking layer; and forming, in the third masking layer, at least one fourth opening having sides and configured to expose a part of the second masking layer, wherein the sides of the third masking layer are preserved, during the epitaxially growing of the at least one second epitaxial layer, from the first epitaxial layer, and/or (b) wherein the cavity has a portion of triangular section along a cross-section parallel to the XY-plane, the portion extending in vertical alignment with the first opening, and/or (c) further comprising:

N-type or P-type doping the first epitaxial layer; and doping of the other type from the N-type or P-type doping of a second doped zone of the second epitaxial layer, the second doped zone extending from the upper face of the second epitaxial layer.

18. The method of claim 17, comprising (a) after the forming of the first epitaxial layer and before the forming of the third opening in the second masking layer:

the depositing of the third masking layer on the second masking layer; and the forming, in the third masking layer, of the at least one fourth opening having the sides and configured to expose the part of the second masking layer, wherein the sides of the third masking layer are preserved, during the epitaxially growing of the at least one second epitaxial layer, from the first epitaxial layer.

19. The method of claim 17, wherein (b) the cavity has the portion of triangular section along a cross-section parallel to the XY-plane, the portion extending in the vertical alignment with the first opening.

20. The method of claim 17, (c) further comprising:

the N-type or P-type doping of the first epitaxial layer; and the doping of the other type from the N-type or P-type doping of a second doped zone of the second epitaxial layer, the second doped zone extending from the upper face of the second epitaxial layer.

* * * * *